(12) United States Patent
Berliner et al.

(10) Patent No.: US 8,900,973 B2
(45) Date of Patent: Dec. 2, 2014

(54) METHOD TO ENABLE COMPRESSIVELY STRAINED PFET CHANNEL IN A FINFET STRUCTURE BY IMPLANT AND THERMAL DIFFUSION

(75) Inventors: Nathaniel C. Berliner, Albany, NY (US); Pranita Kulkarni, Slingerlands, NY (US); Nicolas Loubet, Albany, NY (US); Kingsuk Maitra, Guilderland, NY (US); Sanjay C. Mehta, Niskayuna, NY (US); Paul A. Ronsheim, Hopewell Junction, NY (US); Toyoji Yamamoto, Yokohama (JP); Zhengmao Zhu, Pougkeepsie, NY (US)

(73) Assignees: International Business Machines Corporation, Armonk, NY (US); Globalfoundries Inc., Santa Clara, CA (US); Renesas Electronics America Inc., Santa Clara, CA (US); STMicroelectronics, Inc., Coppell, TX (US)

( * ) Notice: Subject to any disclaimer, the term of this patent is extended or adjusted under 35 U.S.C. 154(b) by 473 days.

(21) Appl. No.: 13/221,198

(22) Filed: Aug. 30, 2011

(65) Prior Publication Data

US 2013/0052801 A1    Feb. 28, 2013

(51) Int. Cl.
*H01L 21/326* (2006.01)
*H01L 21/84* (2006.01)
*H01L 27/12* (2006.01)
*H01L 29/78* (2006.01)

(52) U.S. Cl.
CPC .......... *H01L 21/845* (2013.01); *H01L 27/1211* (2013.01); *H01L 29/7848* (2013.01)
USPC .................... 438/468; 257/E21.327

(58) Field of Classification Search
CPC .............. H01L 21/845; H01L 27/1211; H01L 29/7848
USPC .......................................... 438/468
IPC ........................ H01L 21/845, 27/1211, 29/7848
See application file for complete search history.

(56) References Cited

U.S. PATENT DOCUMENTS 4,728,619 A    3/1988    Pfiester et al.
7,759,175 B2   7/2010    Clavelier et al.
(Continued)

FOREIGN PATENT DOCUMENTS

EP    1 833 094 A1    9/2007

OTHER PUBLICATIONS

Tezuka, et al., "Strain analysis in ultrathin SiGe-on-Insulator layers formed from strained Si-on-Insulator substrates by Ge-condensation process," Applied PHysics Letters 90, 181918, 2007, pp. 90, 181918-1-181918-3.

(Continued)

*Primary Examiner* — Alexander Ghyka
(74) *Attorney, Agent, or Firm* — Gibb & Riley, LLC; Yuanmin Cai, Esq.

(57) ABSTRACT

A method of making a semiconductor device patterns a first fin in a pFET region, and patterns a second fin in an nFET region. A plurality of conformal microlayers containing a straining material are deposited on the first and second fins. A protective cap material is formed on the first fin, and the conformal layers are selectively removed from the second fin. The straining material is then thermally diffused into the first fin. The protective cap material is removed from the first fin after the thermal annealing and after the conformal micro layers are selectively removed from the second fin.

18 Claims, 20 Drawing Sheets

(56) References Cited

U.S. PATENT DOCUMENTS

| | | |
|---|---|---|
| 2008/0173942 A1 | 7/2008 | Zhu et al. |
| 2010/0038679 A1 | 2/2010 | Chan et al. |
| 2010/0308409 A1* | 12/2010 | Johnson et al. ............... 257/368 |
| 2011/0027978 A1* | 2/2011 | Hargrove et al. ............. 438/585 |

OTHER PUBLICATIONS

Nakaharai, et al., "Characterization of 7nm thick strained Ge-on-Insulator layer fabricated by Ge condensation Technique," Applied Physics Letters, vol. 83, No. 17, Oct. 27, 2003, pp. 3516-3518.

\* cited by examiner

METHOD TO ENABLE COMPRESSIVELY STRAINED PFET CHANNEL IN A FINFET STRUCTURE BY IMPLANT AND THERMAL DIFFUSION

BACKGROUND

The embodiments herein generally relate to transistor structures and more particularly to structures that induce channel strain to meet performance targets by incorporating tunable amounts of germanium (Ge) to enhance hole mobility and achieve threshold voltage (Vt) modulation.

A fin-type field effect transistor (FinFET) is a transistor that is formed within a fin of material. A fin is a relatively narrow width, relatively tall height structure that protrudes from the top surface of a substrate. The fin width is intentionally kept small to limit the short channel effect. A fin cap is positioned on the top of the fin and runs along the fin length. The fin cap has a fin cap width equal to the fin width, and fin cap height that is less than the fin height.

In a FinFET, a gate conductor is positioned on the top surface of the substrate and over a portion of the fin. The gate conductor runs parallel to the top of the substrate and is perpendicular to the fin length such that the gate conductor intersects a portion of the fin. An insulator (e.g., gate oxide) separates the gate conductor from the fin and the fin cap. Further, the region of the fin that is positioned below the gate conductor comprises a semiconductor channel region. The FinFET structure can include multiple fins and fin caps, in which case the gate conductor would wrap around, as well as fill in, the space between these fins.

SUMMARY

An exemplary method of making a semiconductor device herein patterns an element of a first fin-type field effect transistor (FinFET) device (such as a fin) on a substrate in a pFET region of the substrate, and patterns an element of a second FinFET device on the substrate in an nFET region of the substrate. A plurality of conformal layers (comprising a straining material) are deposited on the first and second FinFET devices in the pFET and nFET regions, respectively. A protective cap material is patterned to remain on the first FinFET device in the pFET region, and the conformal layers are selectively removed from the second FinFET device in the nFET region. The protective cap material is removed from the first FinFET device in the pFET region after the conformal layers are selectively removed from the second FinFET device, and the straining material is thermally driven into the fins of the pFET regions.

Another method of making a semiconductor device patterns a first fin-type field effect transistor (FinFET) device on a substrate in a pFET region of the substrate. The first FinFET device has two extensions (source/drain regions) extending from a first channel region of the first FinFET device. A second FinFET device is patterned on the substrate in an nFET region of the substrate. The second FinFET device also has two extensions extending from a second channel region of the second FinFET device. The first and the second channel regions of the first and the second FinFET devices are covered with a gate insulator and gate work function metals. A gate conductor is formed on the gate insulator. An insulating spacer is formed along both vertical sides of the gate conductor and over a portion of the first and the second FinFET devices, covering the extension regions of the finFET devices. A plurality of conformal layers having straining material are deposited on the first and second FinFET devices adjacent the gate conductors and the insulating spacers, and a protective cap material is patterned to be formed only on the first FinFET device in the pFET region. The conformal layers from the second FinFET device in the nFET region are selectively removed. Then, the straining material is thermally diffused into the source and drain regions of the pFET fin.

Another method of making a semiconductor device disclosed herein provides a silicon on insulator (SOI) layer, conformally deposits a plurality of conformal layers on the SOI substrate, deposits a hard mask layer on a first pFET region of the substrate and selectively removes the hard mask layer from an nFET region of the substrate. Additionally, the conformal layers are removed from an nFET region of the substrate. The conformal layers are thermally annealed into the first pFET region of the SOI substrate, and transistor structures are formed on the pPET and nFET regions of the substrate.

BRIEF DESCRIPTION OF THE DRAWINGS

The embodiments herein will be better understood from the following detailed description with reference to the drawings, which are not necessarily drawing to scale and in which.

DETAILED DESCRIPTION

Figure 1:
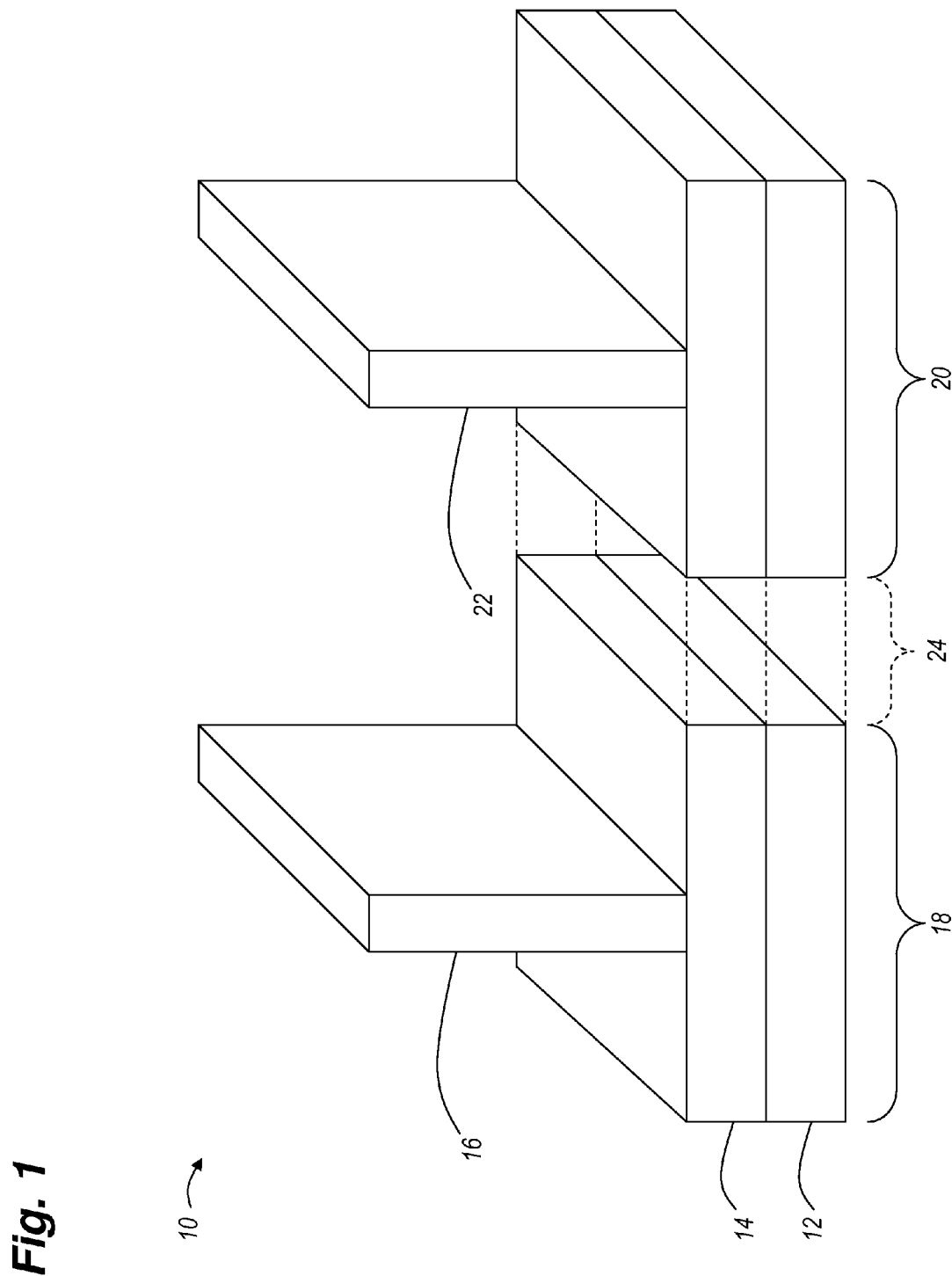
FIG. 1 is a schematic diagram of a disclosed embodiment herein.

The embodiments herein and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned above, the embodiments herein generally relate to transistor structures, such as fin-type field effect transistors (FinFET). While FinFETs provide many substantial benefits when compared to planar transistors, high outer fringe capacitance and external resistance can degrade and limit performance of the FinFET Technology.

Multi-gated fully depleted non-planar complementary metal oxide semiconductors (CMOS) (Trigate or FinFET) are candidates for small devices at the 15 nm node of the logic CMOS devices. Such 3D geometries and the need for continued active area scaling necessitate epitaxial merging of the fins in source/drain regions of the devices to mitigate otherwise high $R_{ext}$. However, this same piece of fin real estate has competing claims from a stress liner in order to modulate the strain parallel and along the length of the device channel. This inability to harness channel strain from the traditional approaches, (eSiGe, eSi-C, Dual Stress Liners/SMT, etc.), raises serious concerns about the performance and extendibility of fully depleted planar and/or non-planar device structures.

In order to address such issues, one exemplary embodiment herein deposits conformal monolayers along the fin sidewalls right after the spacer reactive ion etching (spacer pull down from the fin sidewalls) and external implants, and then drives in the straining material from the conformal monolayers to the fin, using a thermal anneal. For purposes herein, several monolayers of straining material as thin few nanometer are conformally deposited. Further, the embodiments herein enable formation of strained SiGe S/D and/or channel SiGe (c-SiGe) via deposition of Ge and thermal diffusion of Ge into the S/D regions of the fin in the presence of a protective dielectric cap. Ge has 100% solid solubility in Si and being a larger atom, Ge provides strain benefits sitting in the substitutional site inside a Si lattice.

More specifically, one exemplary method provided herein deposits a plurality of conformal Ge monolayers along the fin sidewalls right after the spacer reactive ion etching (RIE) (spacer pull down from the fin sidewalls) and external implants, and then drives Ge into the fin using rapid thermal anneal (RTA, RTA+DSA). The thermal diffusion step can also serve to drive in and activate the straining materials in the extension and source/drain regions. A process referred to herein as Plasma Doping (PD) can be used as one method for the deposition/implantation of the Ge layers. PD uses plasma to generate active radicals of species to be deposited. For Germanium, PD uses GeH4 precursor. PD can be operated both in the implant mode as well as un-biased deposition mode (to minimize damage to substrate). The methods described herein are not limited to the FinFET or TriGATE geometries, but also extend to the fully depleted planar extremely thin silicon-on-insulator (ETSOI) devices where the operation in the implant mode can cause irreparable damage to the thin substrate, potentially amorphizing the entire substrate.

The straining material concentration profiles in the source/drain and extension substrate can be controlled by controlling the initial Ge layer thickness and also rapid thermal annealing (RTA) type of rapid, and high temperature spike annealing to get controllable straining material depth and composition, box shaped profiles and lateral proximity to the channel.

Germanium, if present in the channel region, also lowers the threshold voltage of the pFET devices by moving the band offset closer to the pFET band edge, thus enabling lowering of the threshold voltage and improving the drive currents. Another method herein enables strained substrates with tunable percentage straining material (to achieve tunable Vt) of uniform composition, through thickness, in thin body fully depleted silicon-on-insulator (FDSOI) devices (FinFET, ETSOI/UTBB (ultra thin body and BOX)) that are difficult to implement using conventional c-SiGe approaches. The method can be implemented prior to gate conductor deposition for Vt tuning of the channel, or in a post-gate processing step to achieve channel strain and/or Vt tuning. While many examples presented herein use Germanium (Ge) as an exemplary straining material, the embodiments herein are useful with any substrates and any straining materials (whether currently known or developed in the future).

FIG. 1 is a schematic diagram of a FinFET device 10 that includes a Si substrate 12, a buried oxide (BOX) layer 14, and a first vertical fin 16 extending upwardly from the BOX layer 14 in a pFET region 18 of the FinFET device 10. An nFET region 20 of the FinFET device 10 has a second vertical fin 22 that extends upwardly from the BOX layer 14. Region 24, that is defined by the dashed lines, represent a portion of the FinFET device 10 that separates the pFET region 18 from the nFET region 20. The first and the second FinFET devices have body thicknesses less than approximately one-half the size of the gate length of the FinFET devices.

Figure 2:
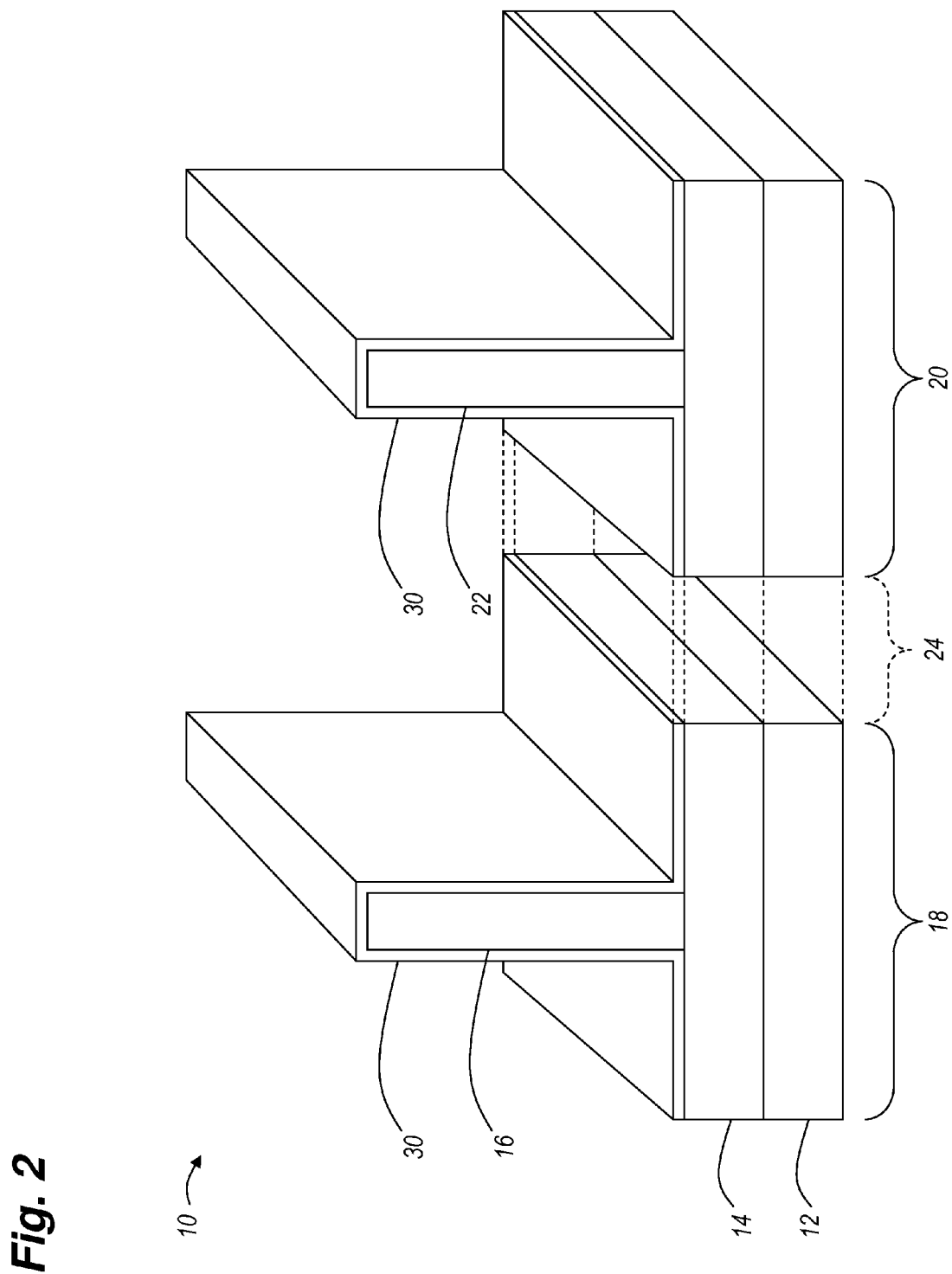
FIG. 2 is a schematic diagram of a disclosed embodiment herein.

FIG. 2 is a schematic diagram illustrating the result of repeated deposition processes that form the multiple monolayers 30 that contain germanium (Ge) over an exposed top portion of the BOX layer 14. The monolayers 30 are also deposited on both the top portion and vertical sides of the first vertical fin 16 and the second vertical fin 22. A bias charge may be applied to the substrate during the conformal depositing of the conformal layers on the first and the second FinFET devices, where the bias charge may comprise a bias below 3 kV. By depositing many monolayers (and potentially using a bias), the thickness of straining material is extremely uniform at all locations, including the full length (height) of the vertical surfaces of the fins. To the contrary, a single thicker straining material layer would be thinner at the top of the fin and thicker at the bottom, resulting in uneven implantation into the fin during annealing. By using a very uniform thickness straining material, the amount of straining material that is driven into the fin (or substrate) is similarly uniform. This permits the amount of strain imparted to be very precisely controlled.

Figure 3:
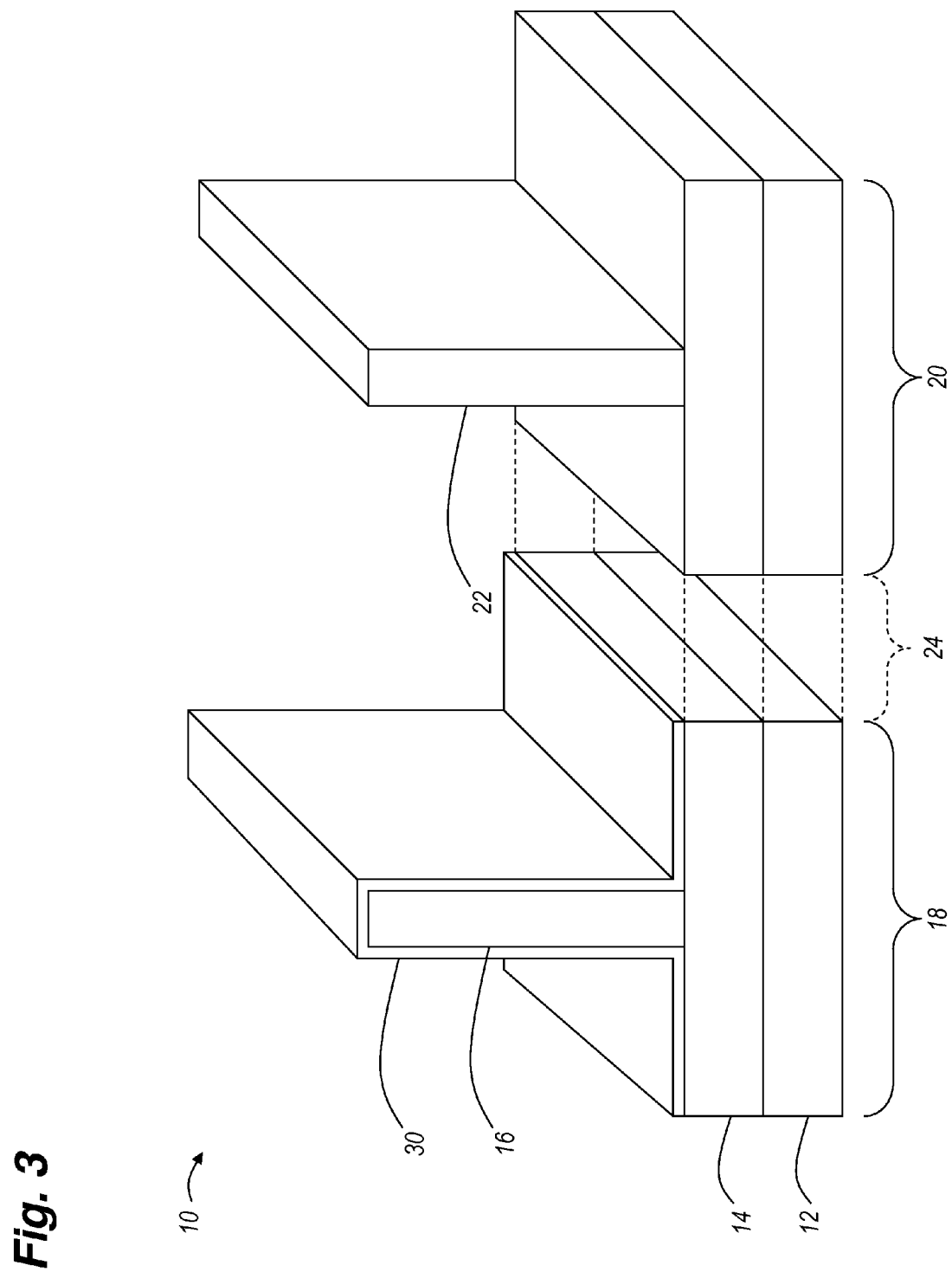
FIG. 3 is a schematic diagram of a disclosed embodiment herein.

FIG. 3 is a schematic diagram illustrating the selective removal of the monolayers 30 on the nFET region 20 portion of the FinFET device 10. This selective removal of the layer 30 is accomplished by patterning a protective cap material layer on the pFET region 18 before the removal of the monolayers 30 on the nFET region 20. This process is performed using any common removal process, such as reactive ion etching (RIE), etc.

Figure 4:
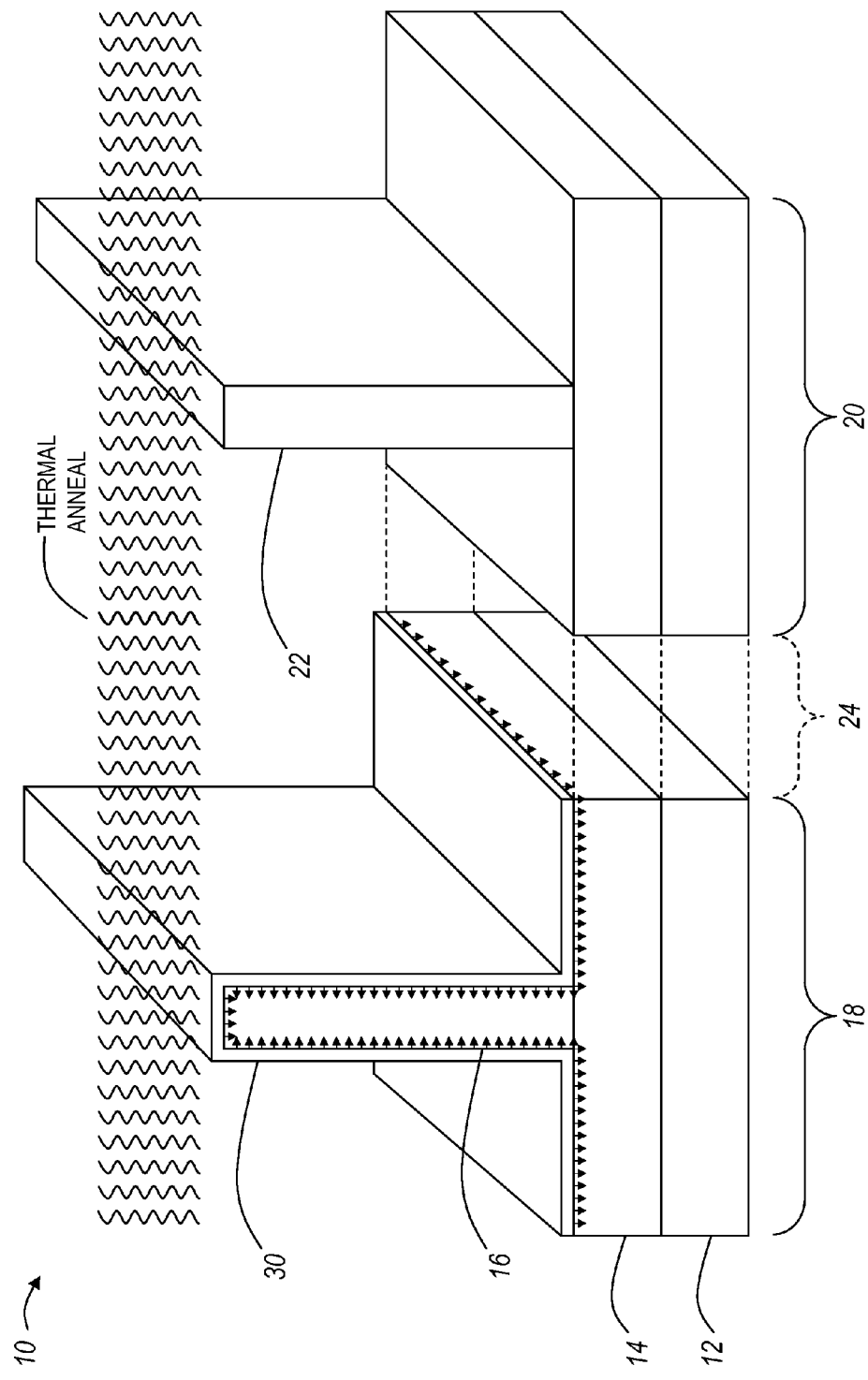
FIG. 4 is a schematic diagram of a disclosed embodiment herein.

FIG. 4 is a schematic diagram illustrating a thermal annealing process performed on the monolayers 30 that drives Ge into the top and vertical sidewall portions of the first vertical fin 16 and the exposed top portion of BOX layer 14 only in the pFET region 18. Note that no Ge is driven into any material in the nFET region 20 due to the previous removal of the monolayers 30 from the nFET region 20. The protective cap material layer is subsequently removed from the pFET region 18.

Figure 5:
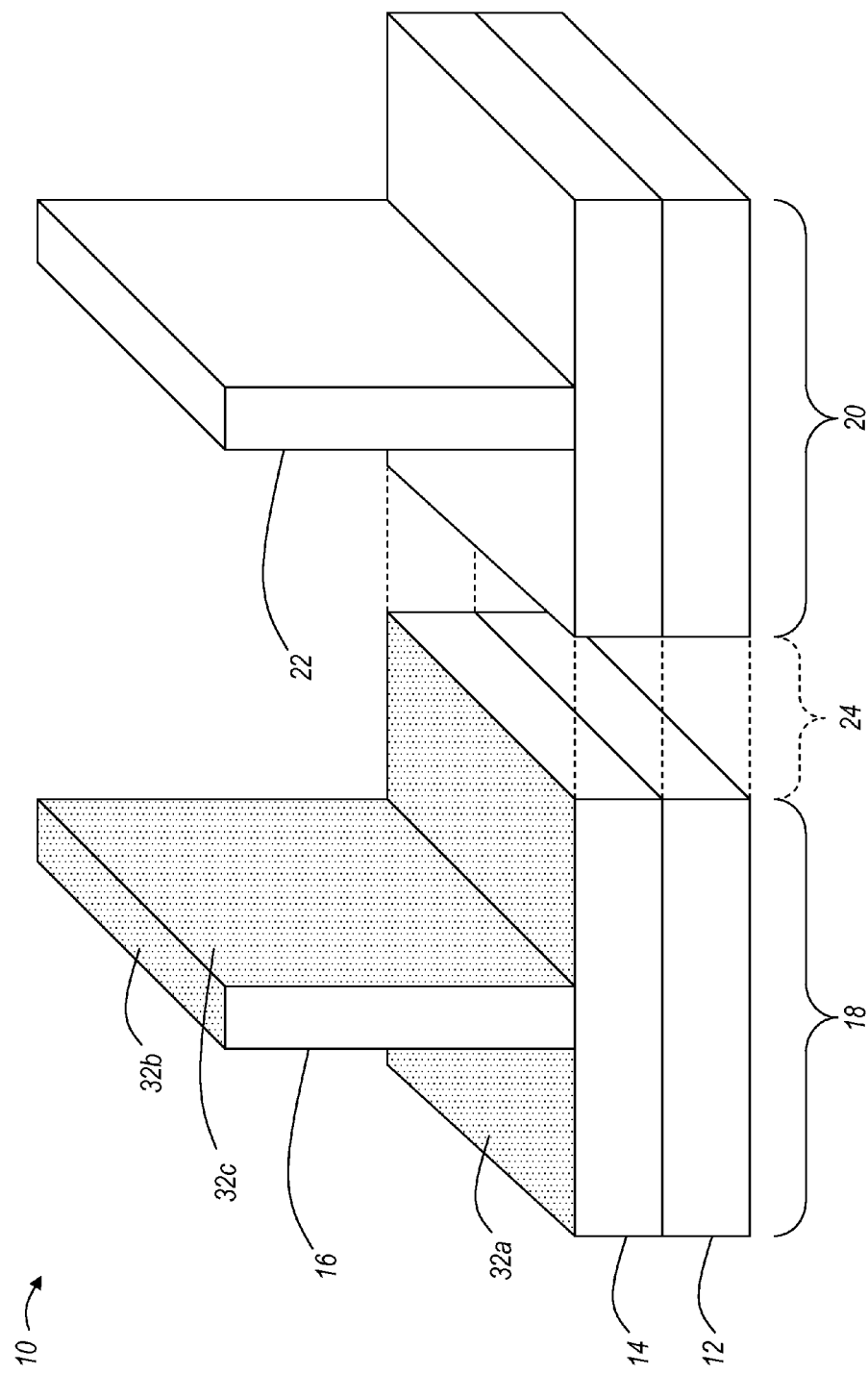
FIG. 5 is a schematic diagram of a disclosed embodiment herein.

FIG. 5 is a schematic diagram illustrating the top exposed portion of the BOX layer 14 that has the straining material at ref. no. 32a, and the top 32b and vertical sidewalls 32c of the first vertical fin 16 having the straining material as a result of the thermal annealing process illustrated in FIG. 4. Note the straining material is represented at ref. nos. 32a-c by the shaded portions of the respective described elements.

Figure 6:
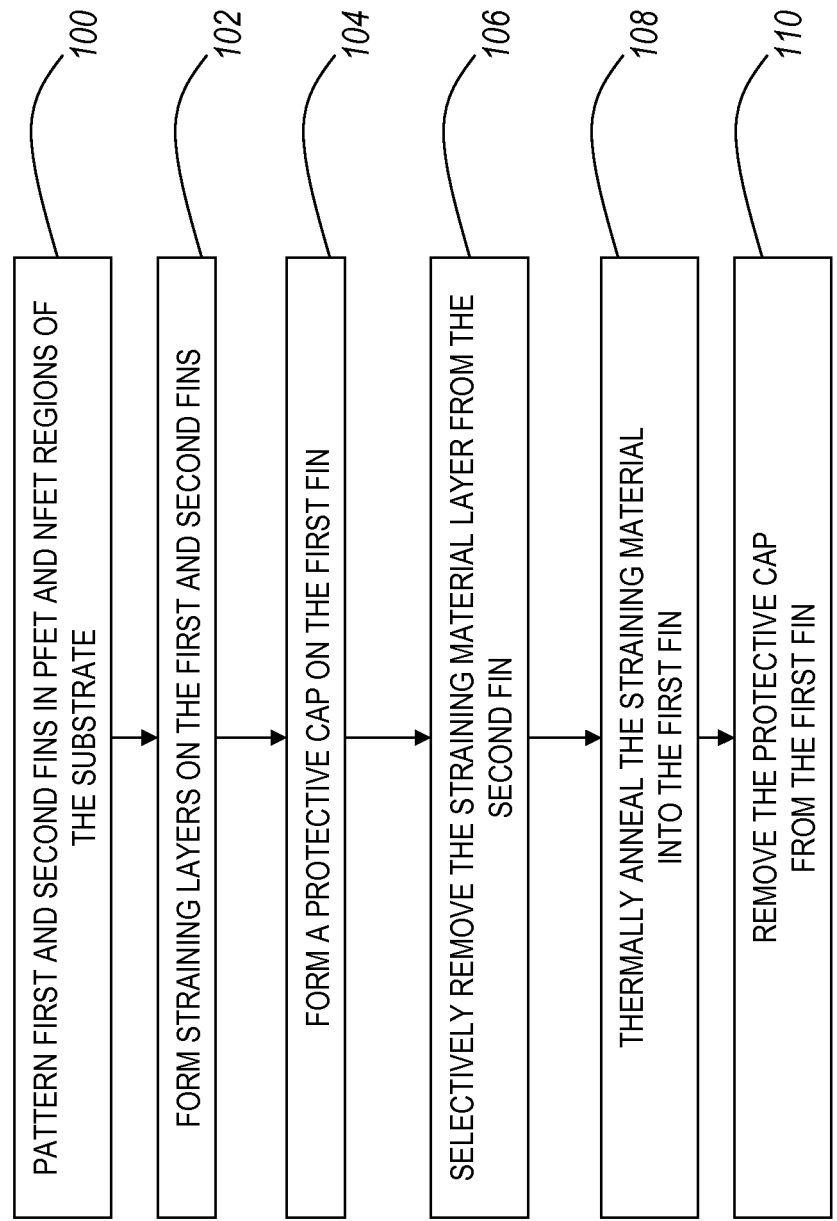
FIG. 6 is a logic flowchart of a disclosed embodiment herein pertaining to FIGS. 1-5.

FIG. 6 is a logic flowchart showing one method herein that relates to FIGS. 1-5. This exemplary method patterns a first fin in a pFET channel region and patterns a second fin in an nFET channel region (step 100). A plurality of conformal monolayers are then formed on the first and second fins in step 102. A protective cap material is patterned to remain only on the first fin in step 104. The conformal layers are selectively removed from the second fin in 106. The straining material is thermally annealed into the first fin in step 108. The protective cap material is removed from the first fin in the pFET channel region 110. Following this, the remainder of the transistors are formed (e.g., channel implants, gate oxide, gate conductor, source drain, etc.) using well-known processing.

The straining material imparts a compressive strain to the surface Si channel of the first FinFET device and converts a portion of the surface Si of the fin into an alloy of silicon. By introducing Ge in the channel by Ge diffusion in pFET fins prior to the gate patterning, this processing lowers the threshold voltage and enhances carrier mobility. The straining material may comprise, for example, Germanium or Carbon. Thus, by thermally driving the Ge prior to forming the gate, the channel region receives the Ge and the Vt tuning of the pFET transistor can be controlled in a precise manner.

FIGS. 7-13 are schematic diagrams of a second disclosed embodiment herein and illustrate monolayers being formed, and a thermal annealing process similar to FIGS. 1-5. However, in FIGS. 7-13, the processing is instead performed on a FinFET device after a gate conductor has been fabricated over the FinFET device. Reference numbers of similar elements in this second embodiment will correlate to reference numbers of the first embodiment of FIGS. 1-5 when possible.

Figure 7:
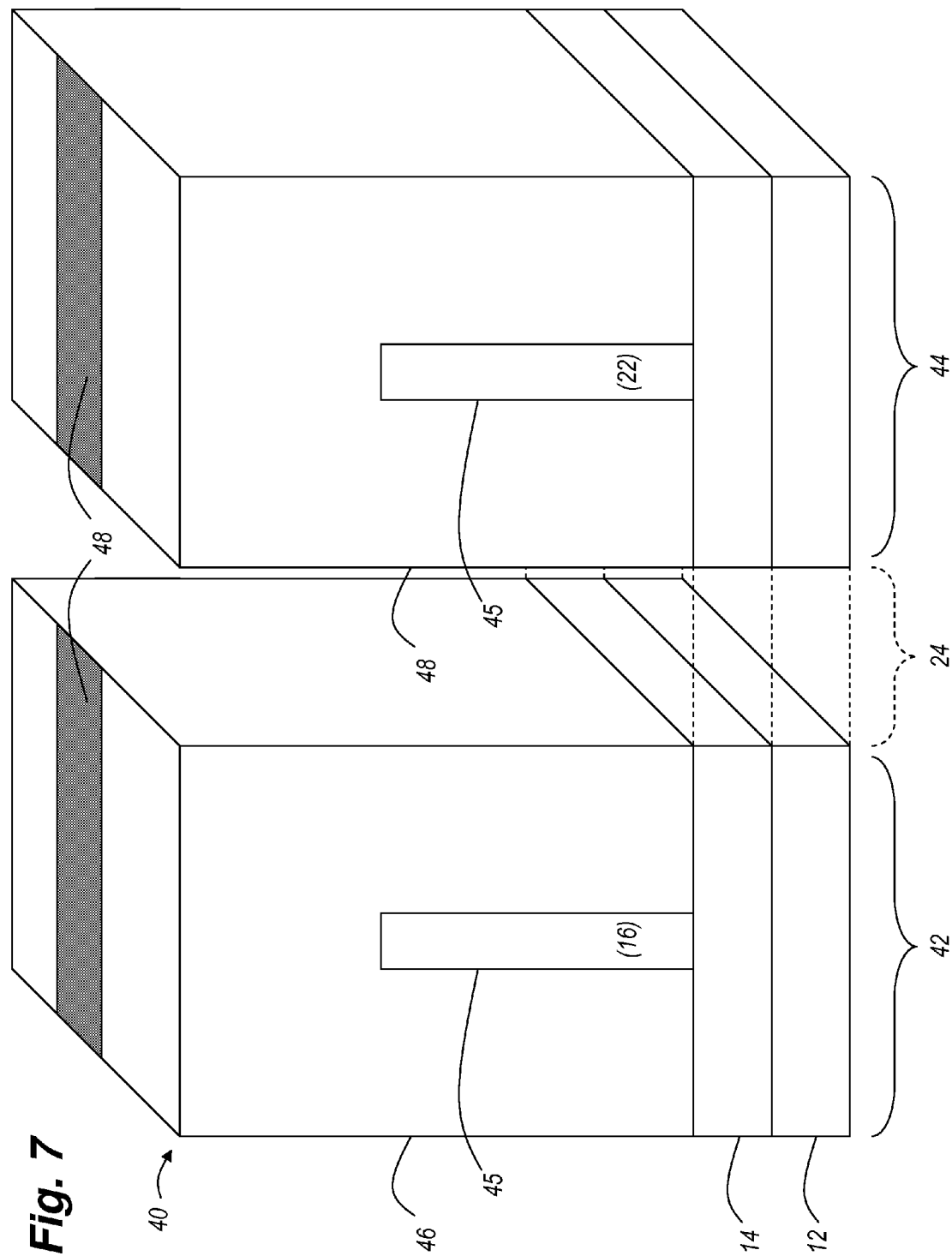
FIG. 7 is a schematic diagram of another disclosed embodiment herein.

FIG. 7 is a schematic diagram illustrating a FinFET device 40 that includes a Si substrate 12 and BOX layer 14. As shown, the first vertical fin 16 and a second vertical fin 22 are disposed on the top surface of the BOX layer 14 in two respective portions of the FinFET device 40: a pFET region 42, and an nFET region 44. Each region is separated by an isolating portion 24 of the FinFET device 40. A gate insulator 45 is formed over the first 16 and second 22 vertical fins. A gate conductor 46 is formed over the gate insulator 45. The gate insulator 45 is formed on the first vertical fin 16 in the pFET region 42. A corresponding gate conductor 48 is formed over the gate insulator 45, which is formed on the second vertical fin 22 in the nFET region 44. A hard mask layer 48 is deposited over each gate conductor 46/48 in their respective regions 42/44.

Figure 8:
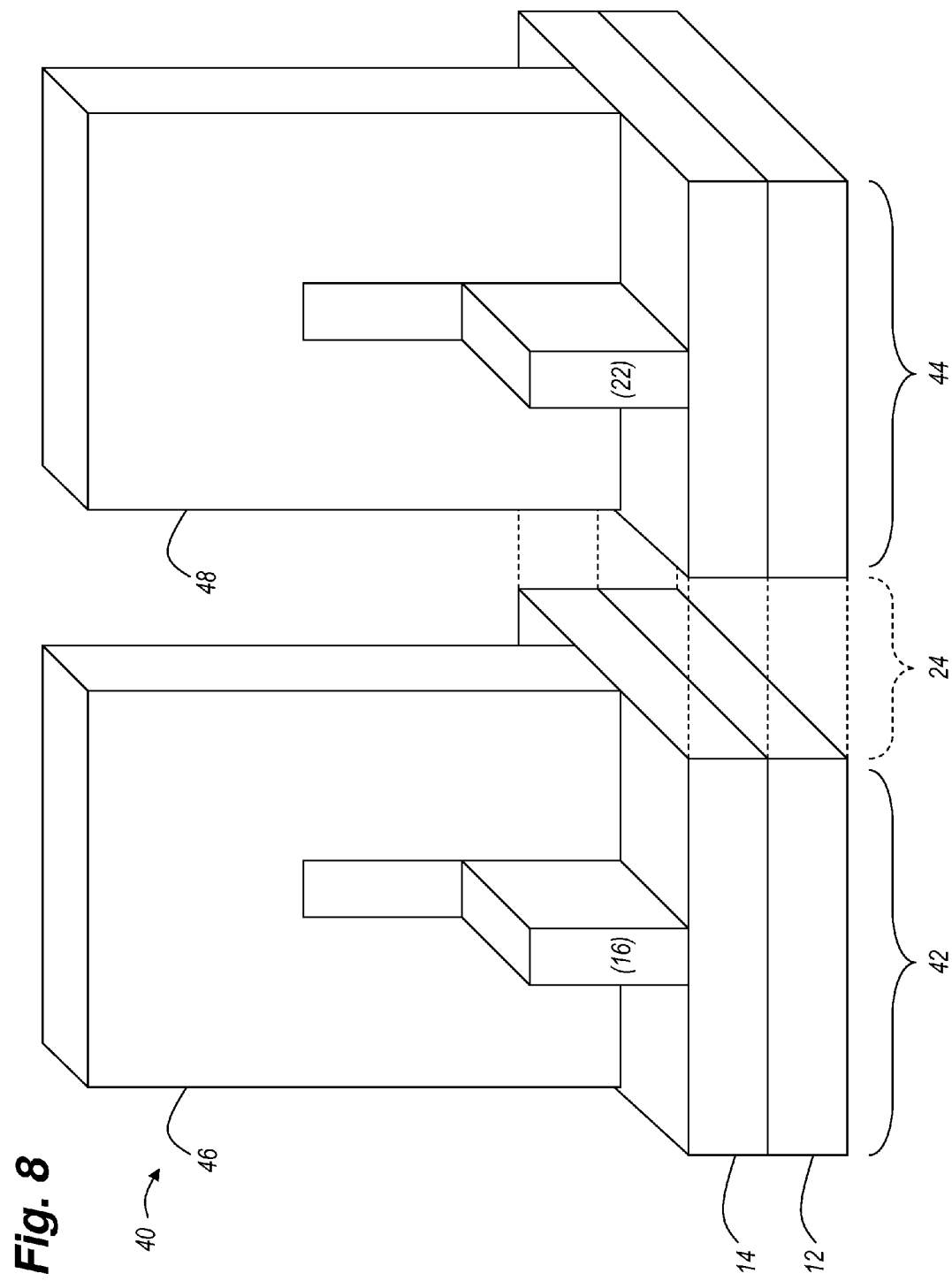
FIG. 8 is a schematic diagram of another disclosed embodiment herein.
Figure 9:
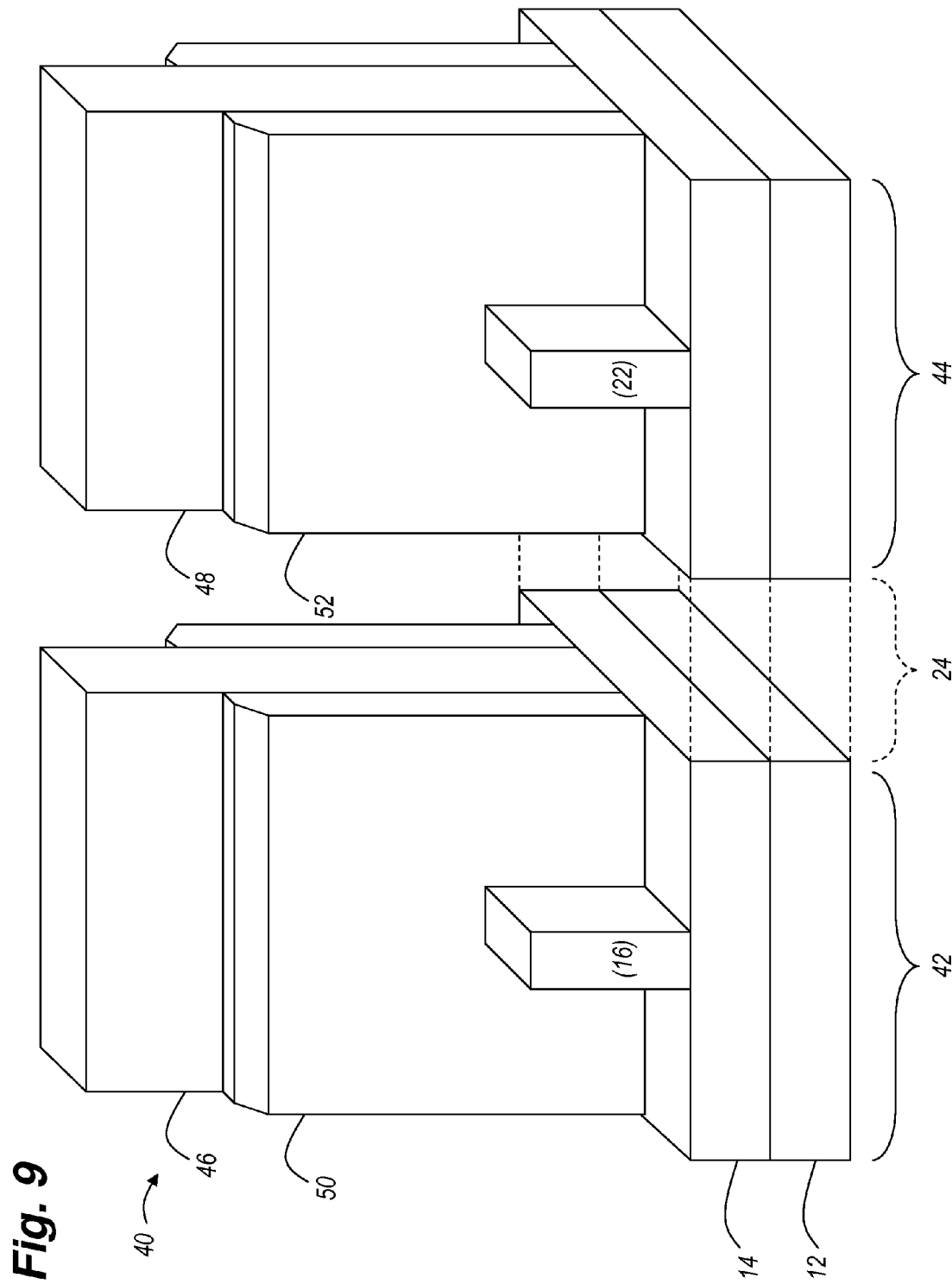
FIG. 9 is a schematic diagram of another disclosed embodiment herein.
Figure 10:
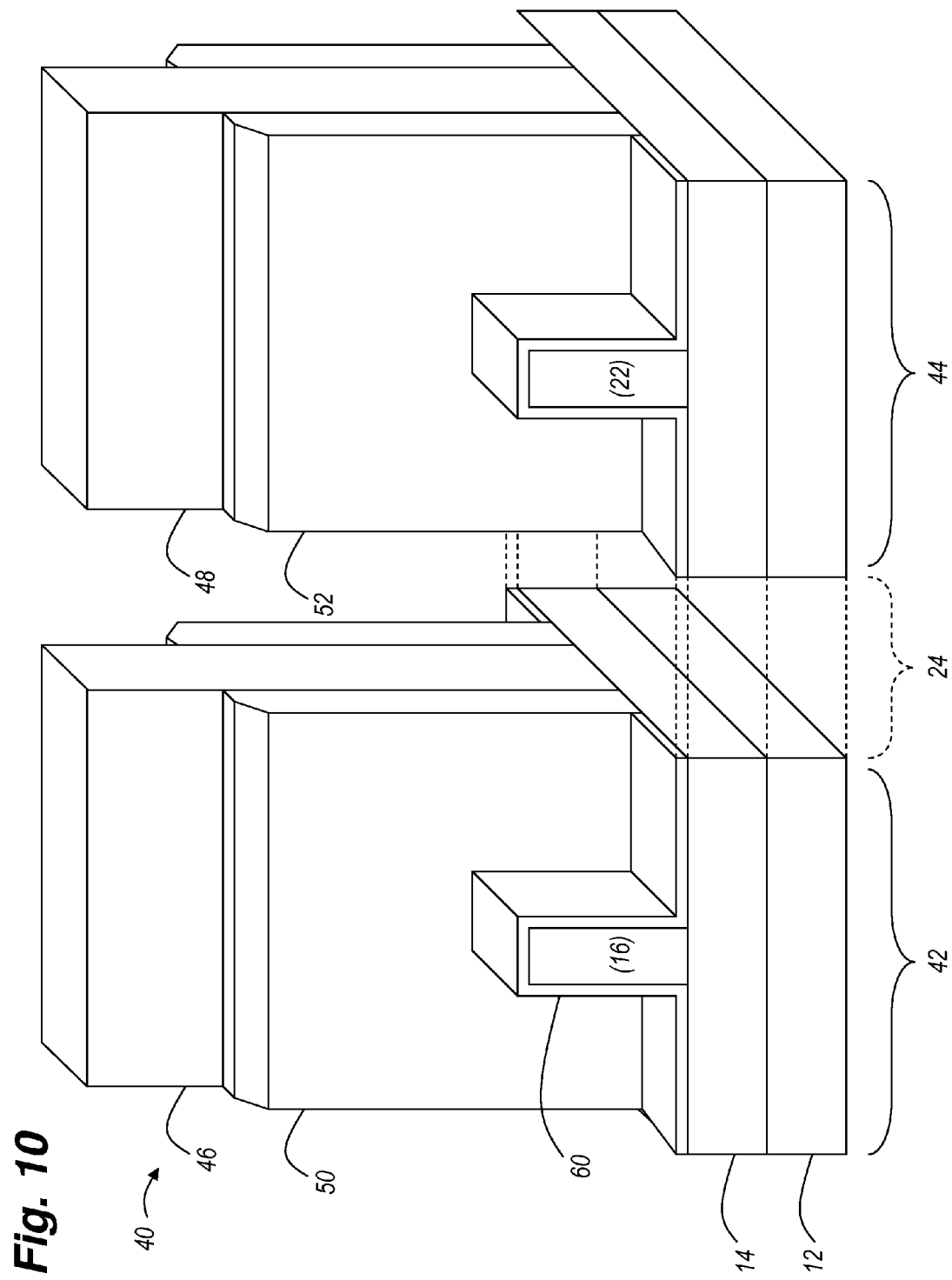
FIG. 10 is a schematic diagram of another disclosed embodiment herein.

FIG. 8 is a schematic diagram illustrating portions of the fins 16, 22 being removed via a material removal process and the hard mask layer 48 being removed in a subsequent hardmask removal process. The upper portion of each fin 16 and second 22 vertical fins that are exposed on either side of the gates 46/48 is removed. FIG. 9 is a schematic diagram illustrating the deposition of nitride spacers 50/52 on both sidewall portions of the gates 46/48, respectively, and over corresponding top portions of the first 16 and second 22 vertical fins. FIG. 10 is a schematic diagram illustrating the deposition of the monolayer containing straining material 60 on the exposed portions of the first 16 and second 22 vertical fins in both the pFET region 42 and the nFET region 44.

Figure 11:
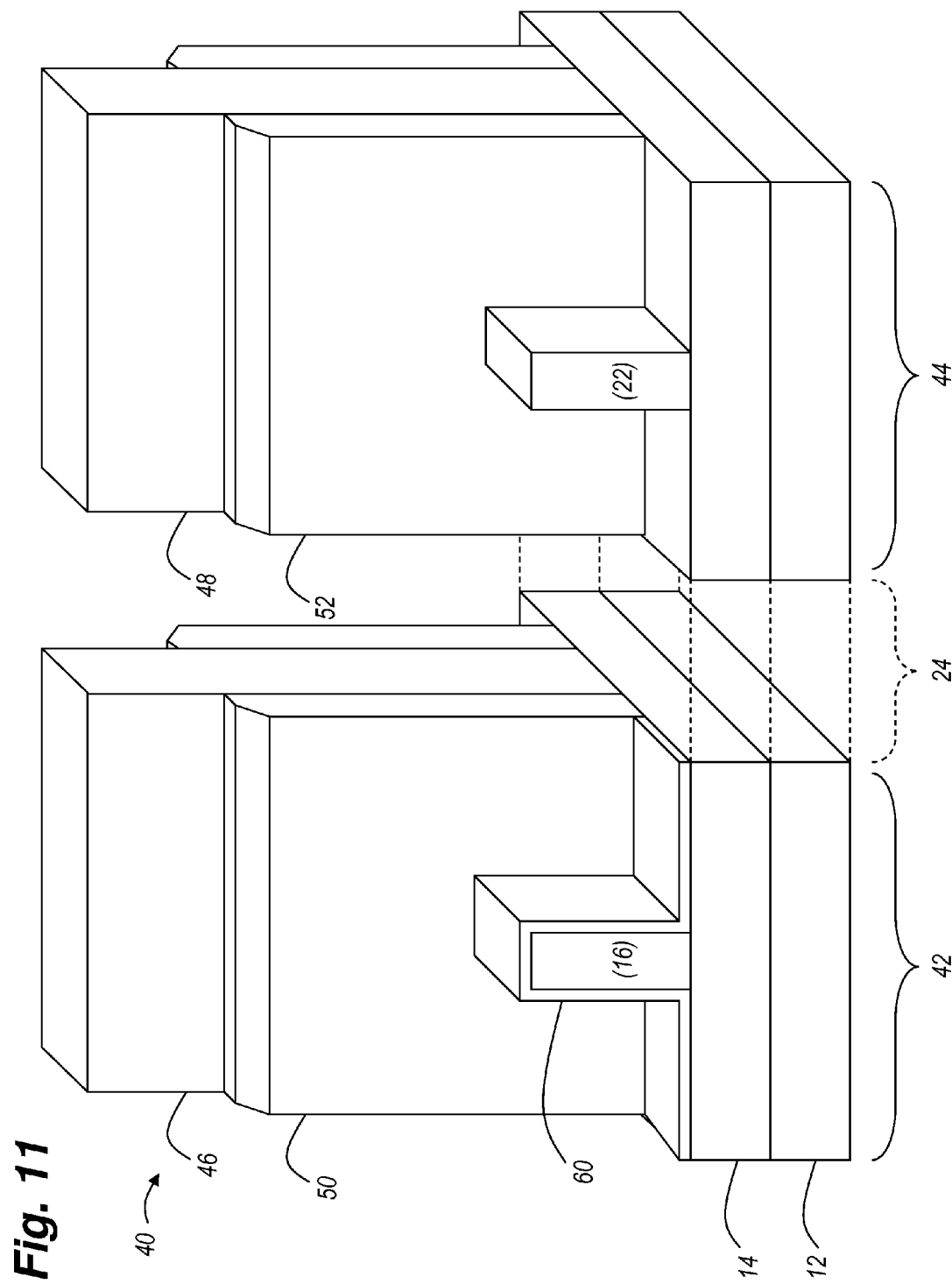
FIG. 11 is a schematic diagram of another disclosed embodiment herein.

FIG. 11 is a schematic diagram illustrating the selective removal of the monolayers 60 from the nFET region 44. This particularly removes the Ge layers 60 from the exposed top surface of the BOX layer 14 and the top and vertical sidewall surfaces of the second vertical fin 22. This selective removal of the layer 60 is accomplished by depositing a protective cap material layer, (not shown), on the pFET region 42 before the removal of the monolayers 60 on the nFET region 44.

Figure 12:
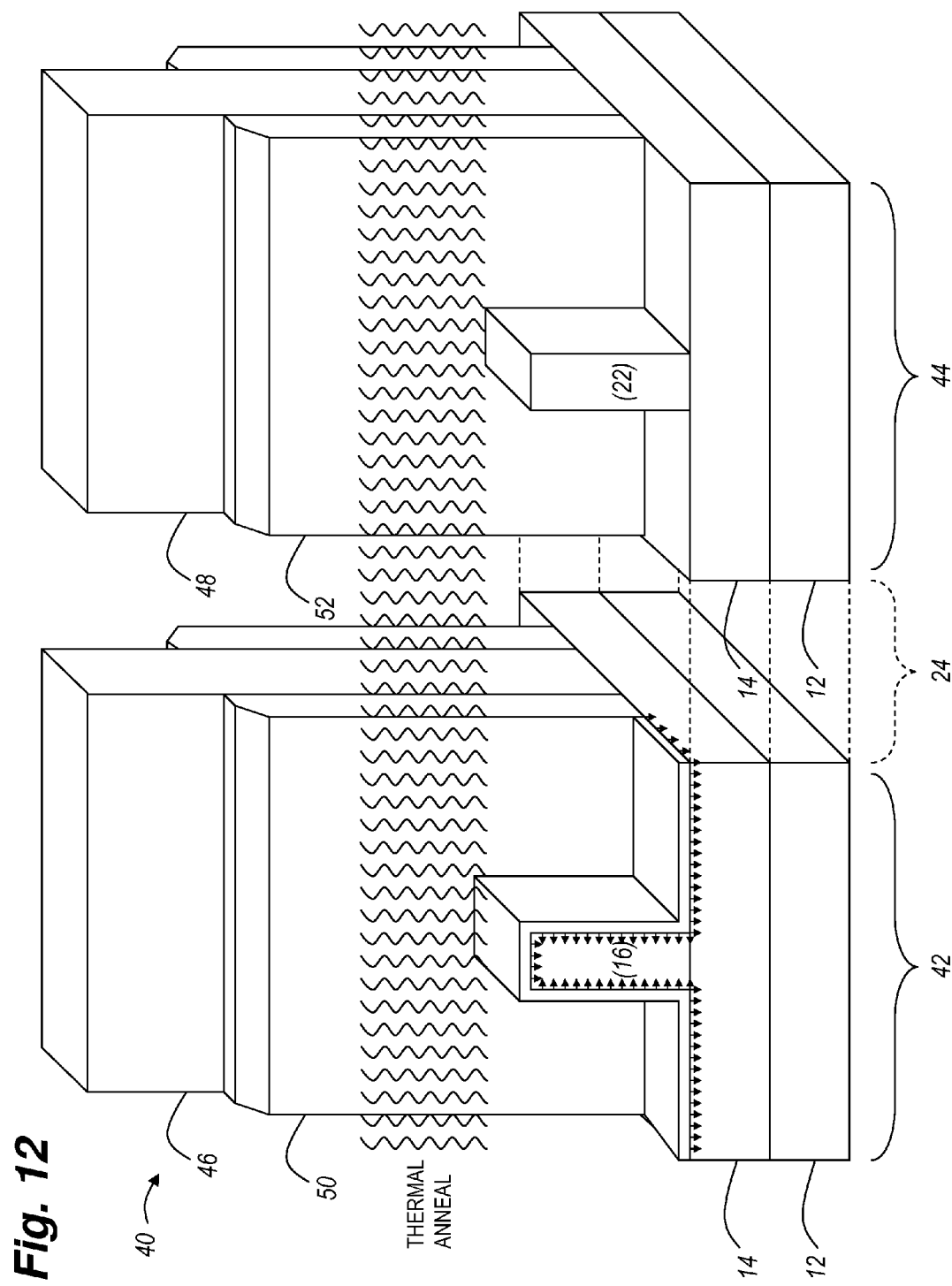
FIG. 12 is a schematic diagram of another disclosed embodiment herein.

FIG. 12 is a schematic diagram illustrating the thermal annealing process performed on the plurality of monolayers 60 that drives Ge into the top and vertical sidewall portions of the first vertical fin 16 and the exposed top portion of BOX layer 14 only in the pFET region 42. Note that no Ge is driven into any material in the nFET region 44 due to the previous removal of the monolayers 60 in the nFET region 44. The protective cap material layer is subsequently removed from the pFET region 42 after the thermal annealing process is performed on the monolayers 60 in the pFET region and after the previous step of selectively removing the monolayers 60 in the nFET region 44.

Figure 13:
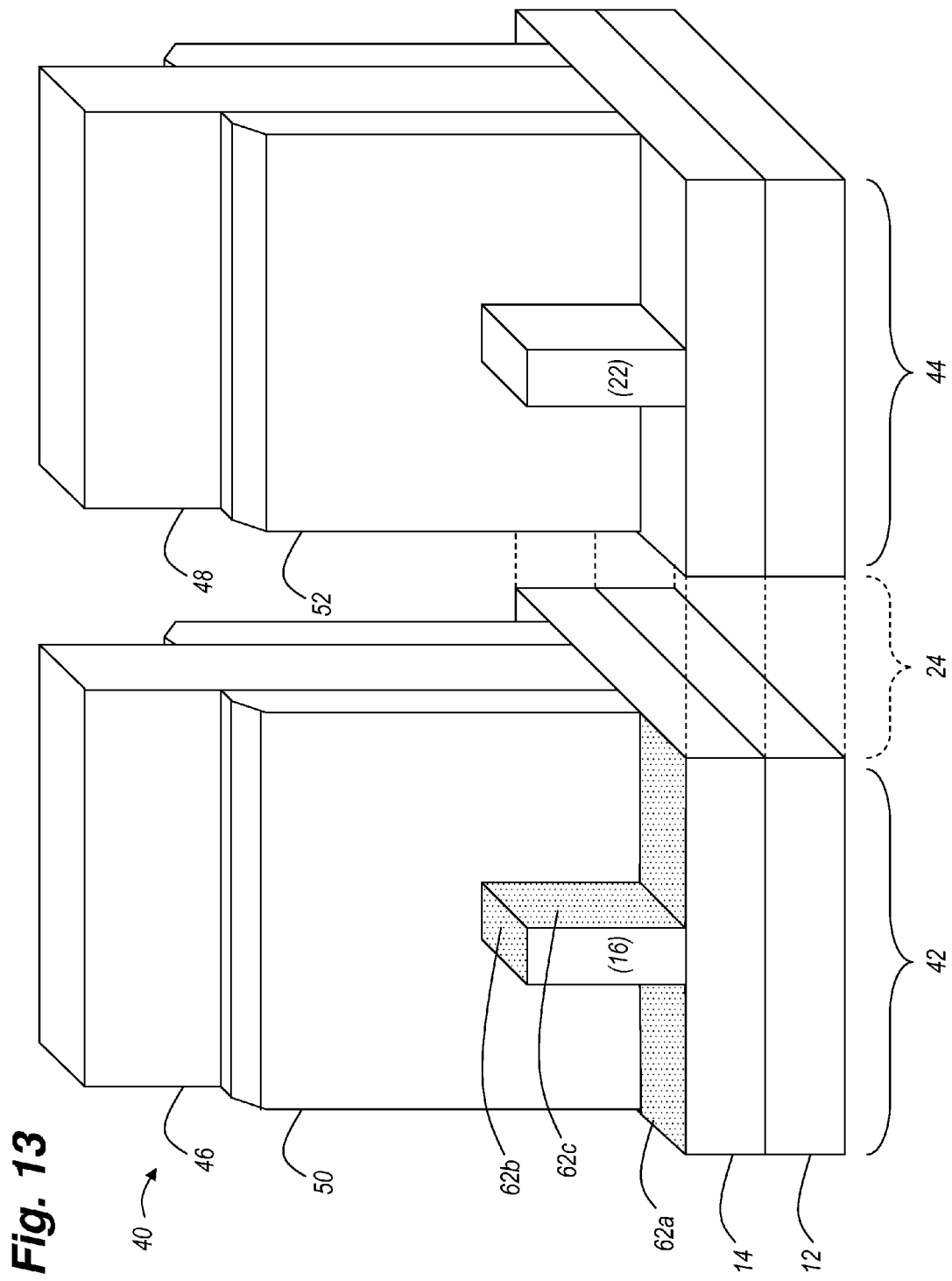
FIG. 13 is a schematic diagram of another disclosed embodiment herein.

FIG. 13 is a schematic diagram illustrating the top exposed portion of the BOX layer 14 that has the straining material at ref. no. 62a, and the top 62b and vertical sidewalls 62c of the first vertical fin 16 having the straining material as a result of the thermal annealing process illustrated in FIG. 12. Note the straining material is represented at ref. nos. 62a-c by the shaded portions of the respective described elements. Again, by depositing many monolayers of straining material (and potentially using a bias), the thickness of straining material is extremely uniform at all locations, including the vertical surfaces of the fins. By using a very uniform thickness straining material, the amount of straining material that is driven into the fin (or substrate) is similarly uniform. This permits the amount of strain imparted to be very precisely controlled.

Figure 14:
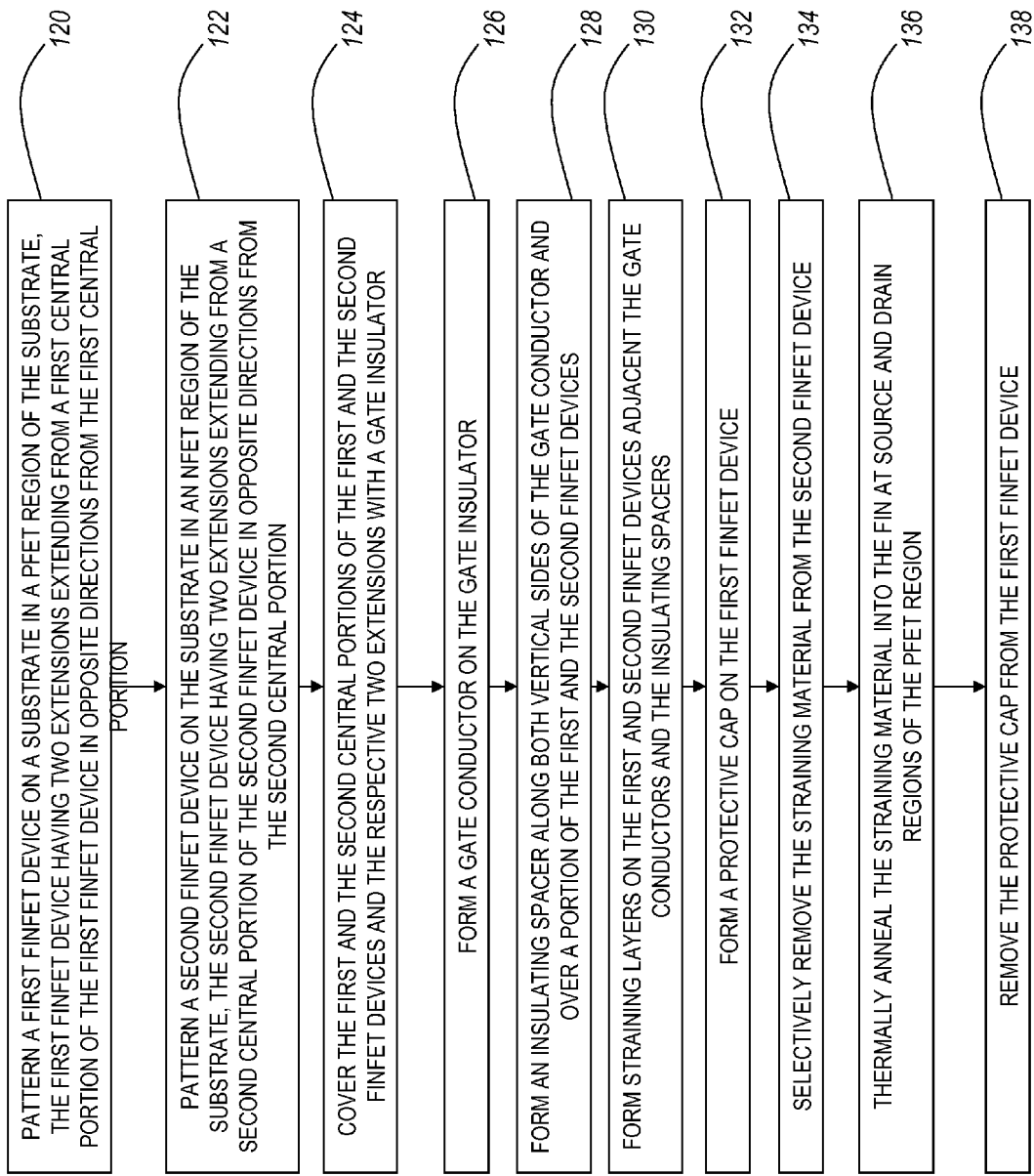
FIG. 14 is a logic flowchart of another disclosed embodiment herein pertaining to FIGS. 7-13.

FIG. 14 is a logic flowchart pertaining to FIGS. 7-13. This exemplary method patterns a first fin-type field effect transistor (FinFET) device in a pFET channel region in step 120. This first FinFET device has two channel extensions extending from a first central channel portion of the first FinFET device in opposite directions. A second FinFET device is patterned in an nFET channel region in step 122. Steps 120 and 122 can be performed simultaneously (or in any order). The second FinFET device also has two channel extensions extending from a second central channel portion of the second FinFET device in opposite directions. The first and the second central channel portions of the first and the second FinFET devices and the respective two channel extensions are covered with a gate insulator in step 124, and a gate conductor is formed on the gate insulator in step 126. An insulating spacer is then formed along both vertical sides of the gate conductor and over a portion of the first and the second FinFET devices in step 128. A plurality of conformal layers are next deposited on the first and second FinFET devices adjacent the gate conductors and the insulating spacers in step 130. A protective cap material is then patterned to remain only on the first FinFET device in the pFET channel region in step 132. The conformal layers from the second FinFET device in the nFET channel region are selectively removed in step 134. The straining material is thermally annealed into the fin at source and drain regions of the pFET channel portion in step 136. The protective cap material is removed from the first FinFET device in the pFET channel region after thermally annealing and after the conformal layers is selectively removed from the second FinFET device in step 138.

The straining material in the lateral regions of the fin imparts a compressive strain to the central region (channel region) of the first FinFET device. By introducing Ge in the pFET fins after the gate patterning, this processing imparts strain on the pFET channel regions; however, since Ge is not driven into the channel regions, the Vt is not substantially changed. The thermal annealing diffuses the straining material into source and drain regions of the first FinFET device. Thus, by thermally driving the Ge into the fin of the pFET after forming the gate, the strain applied to the channel of the pFET transistor from the source/drain regions can be controlled in a precise manner.

FIGS. 15-19 are schematic diagrams of a third disclosed embodiment herein illustrating monolayers being formed, and a thermal annealing process similar to FIGS. 1-5, but instead being performed on a planar device before any vertical fin or gate conductor has been fabricated over the planar device. Reference numbers of similar elements in this third embodiment will correlate to reference numbers of the first and second embodiments of FIGS. 1-14 when possible.

Figure 15:
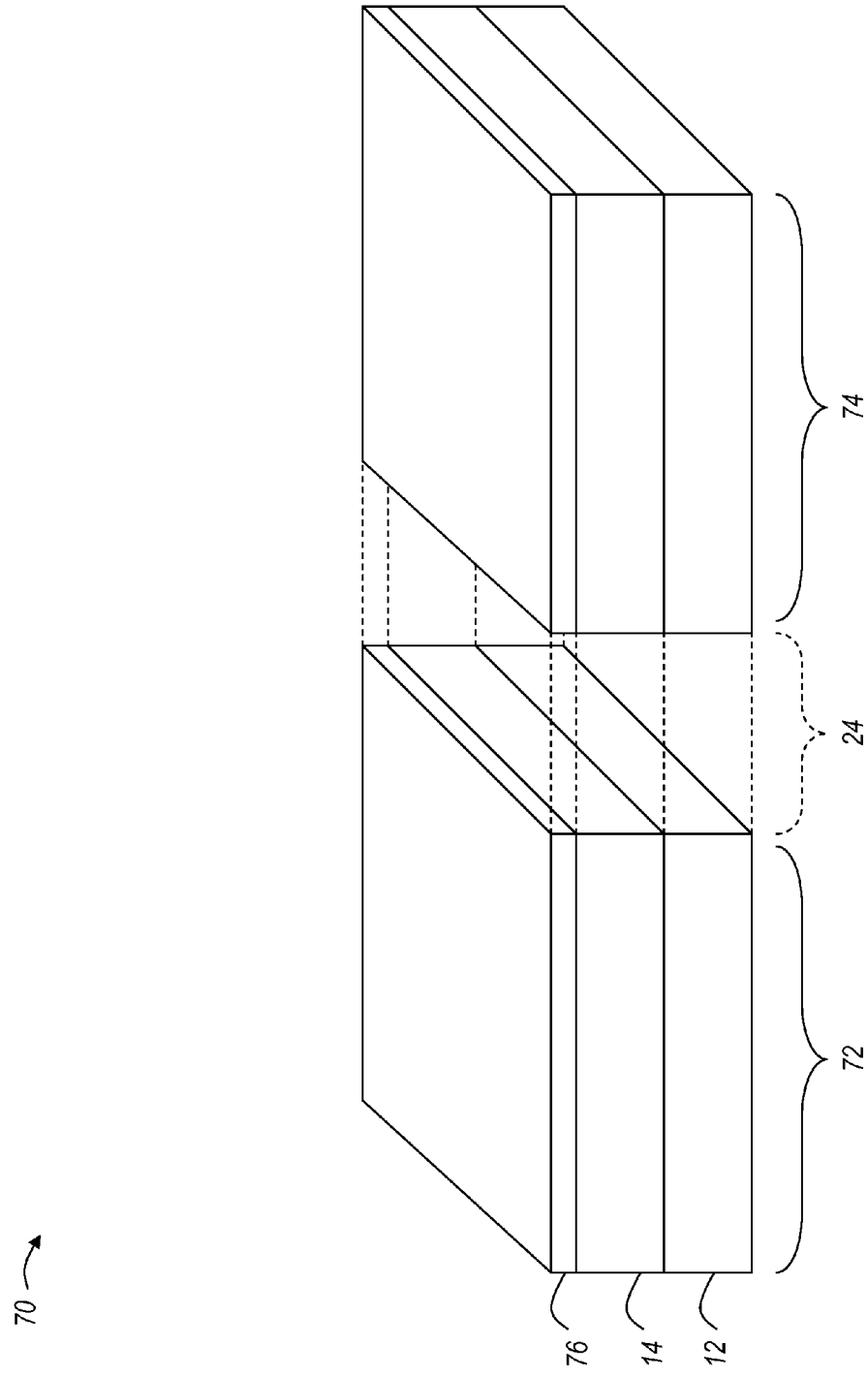
FIG. 15 is a schematic diagram of another disclosed embodiment herein.
Figure 16:
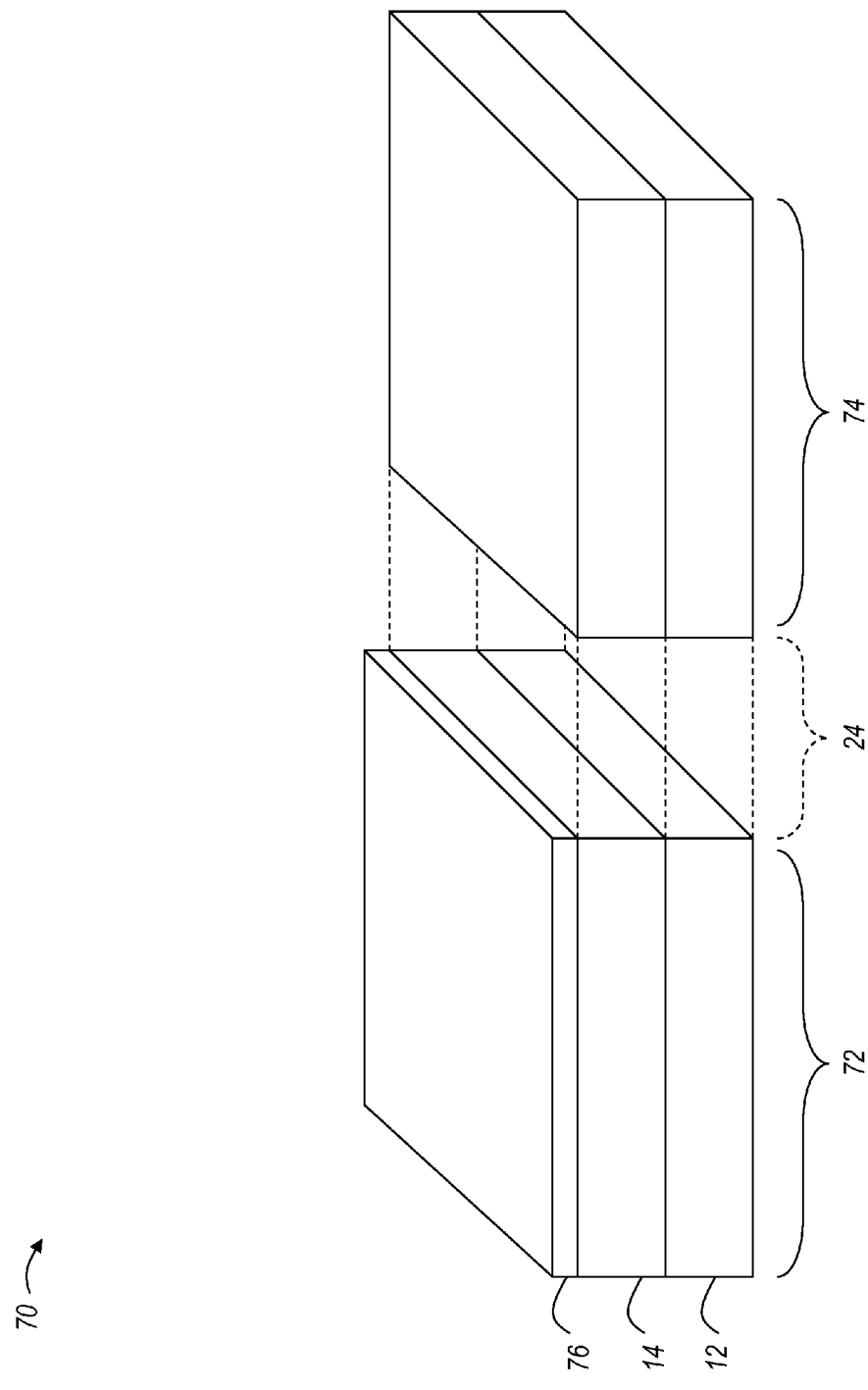
FIG. 16 is a schematic diagram of another disclosed embodiment herein.

FIG. 15 is a schematic diagram of a third disclosed embodiment herein illustrating a planar device 70 having a Si substrate 26 and BOX layer 14 having two respective portions of the planar device 70: a pFET region 72, and an nFET region 74, each region separated by an isolating portion 24 of the planar device 70. Monolayers containing a straining material 76 are deposited on both pFET and nFET regions 72/74. FIG. 16 is a schematic diagram illustrating the selective removal of the monolayers 76 from the nFET region 74 such that the monolayers 76 remain on the pFET region 72 of the planar device 70. This selective removal of the layer 76 is accomplished by depositing a protective cap material layer, (not shown), on the pFET region 72 before the removal of the monolayers 76 on the nFET region 74.

Figure 17:
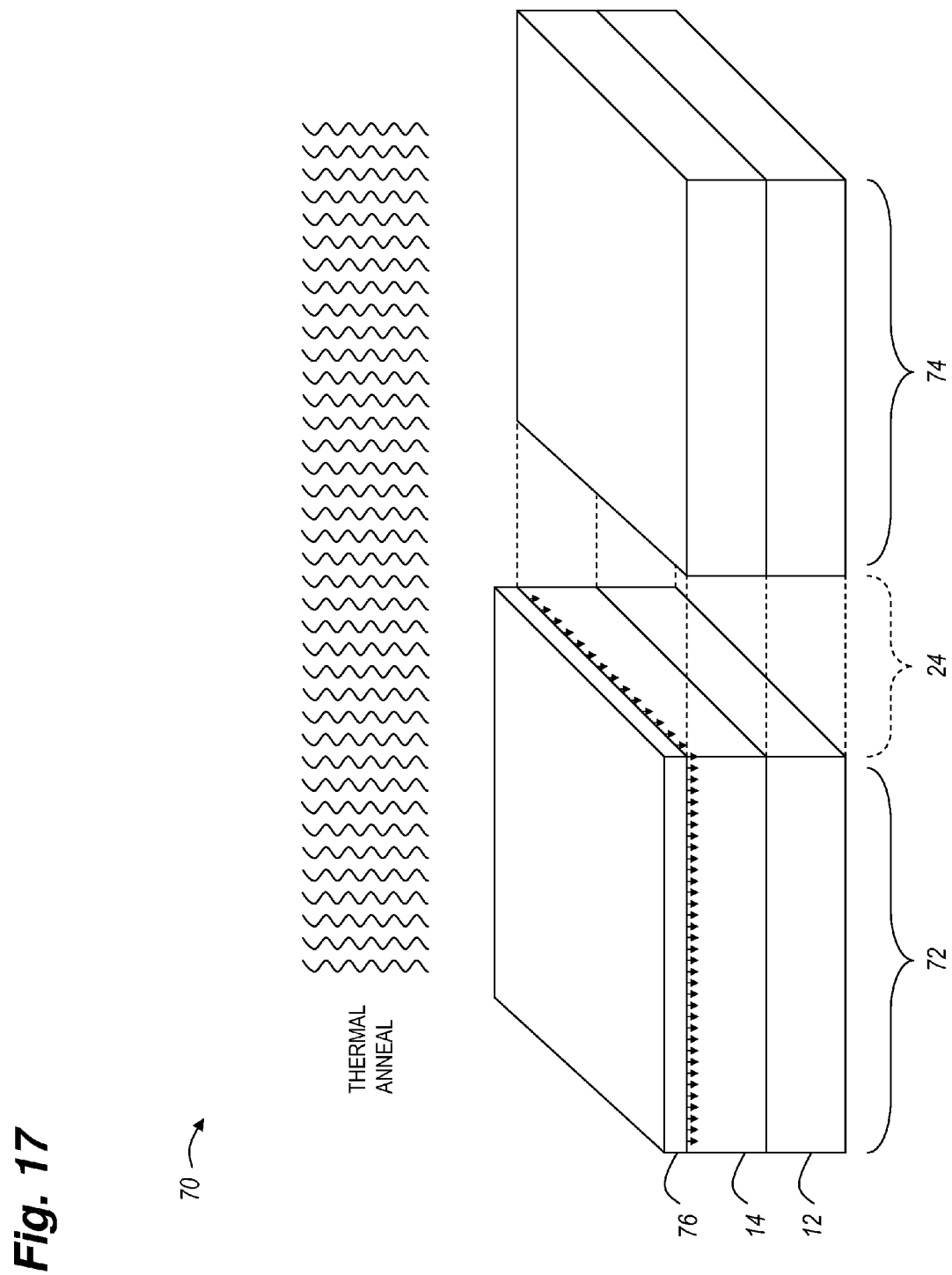
FIG. 17 is a schematic diagram of another disclosed embodiment herein.

FIG. 17 is a schematic diagram illustrating the thermal annealing process performed on the monolayers 76 that drives Ge into the top portion of the silicon substrate 26 only in the pFET region 42. Note that no Ge is driven into any material in the nFET region 74 due to the previous removal of the monolayers 76 in the nFET region 74. The protective cap material layer is subsequently removed from the pFET region 72 after thermal annealing of the monolayers 76 in the pFET region 72 and after the monolayers 76 in the nFET region 74 is removed.

Figure 18:
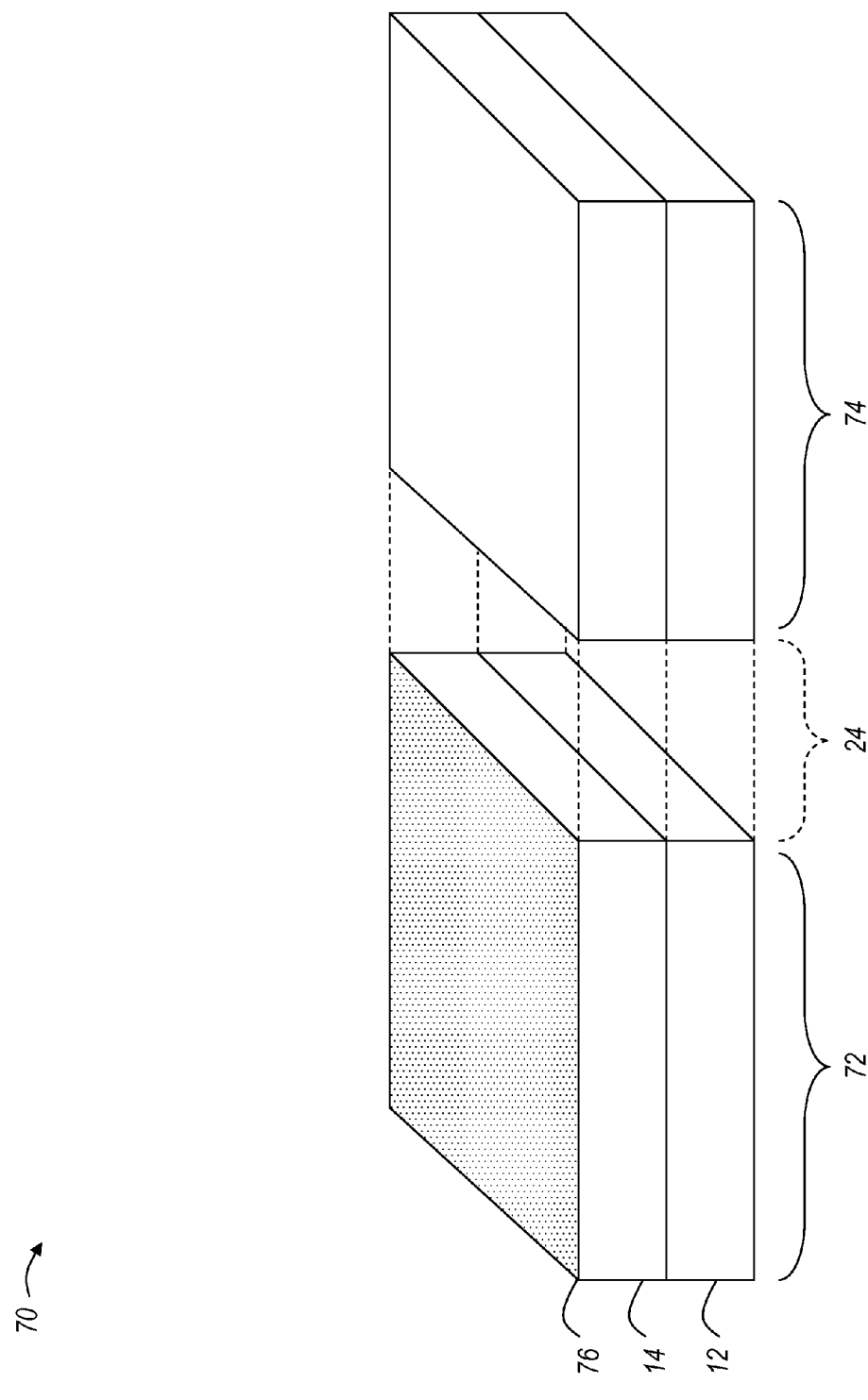
FIG. 18 is a schematic diagram of another disclosed embodiment herein.
Figure 19:
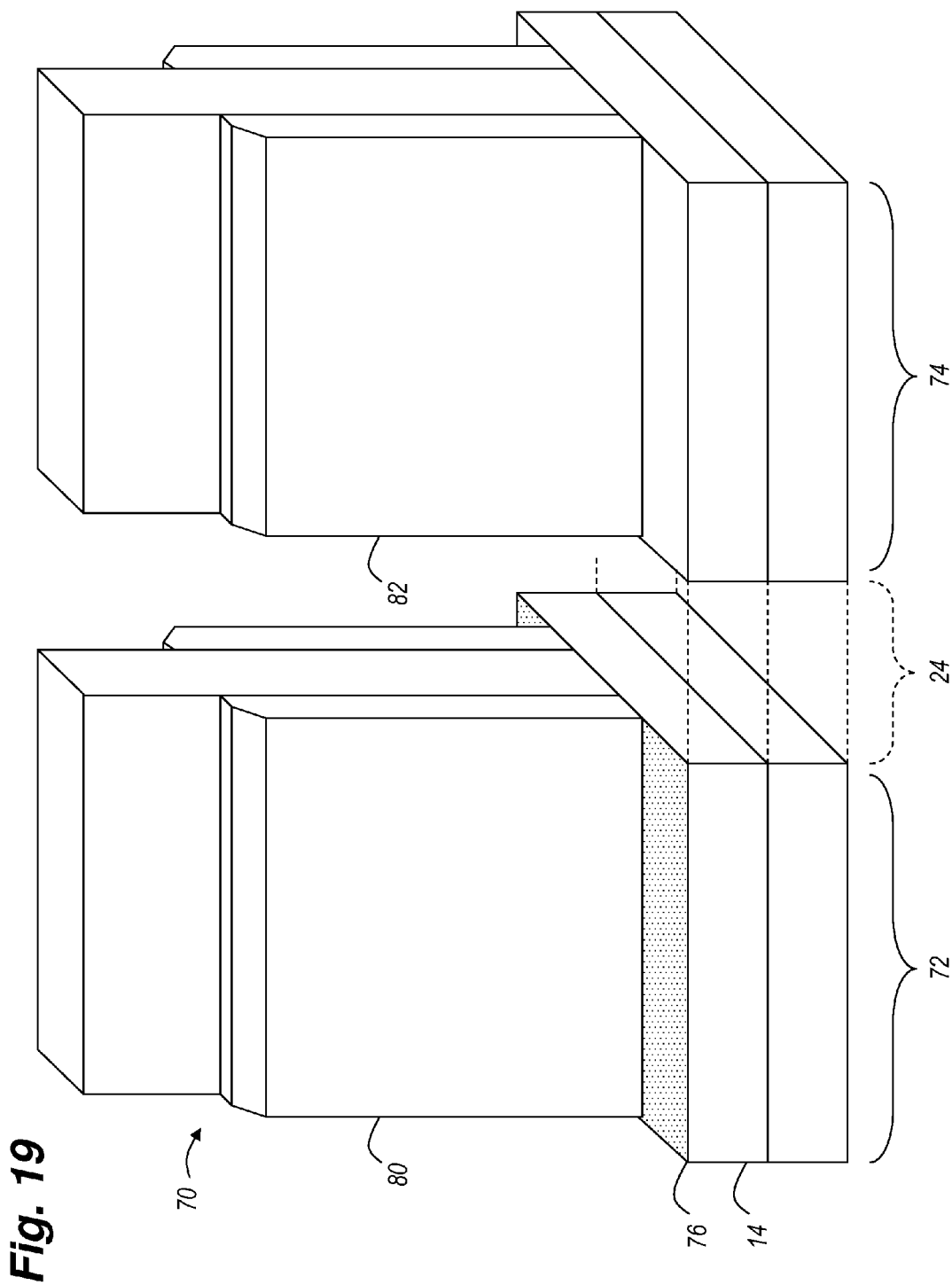
FIG. 19 is a schematic diagram of another disclosed embodiment herein.

FIG. 18 is a schematic diagram illustrating the top exposed portion of the silicon substrate 26 that has the straining material as a result of the thermal annealing process illustrated in FIG. 17. Note the straining material is represented by the shaded portion on the top of the silicon substrate 26. FIG. 19 is a schematic diagram illustrating the fabrication of gate conductors 80/82 on the respective top portions of the silicon substrate 26 of the pFET region 72 and nFET region 74.

Figure 20:
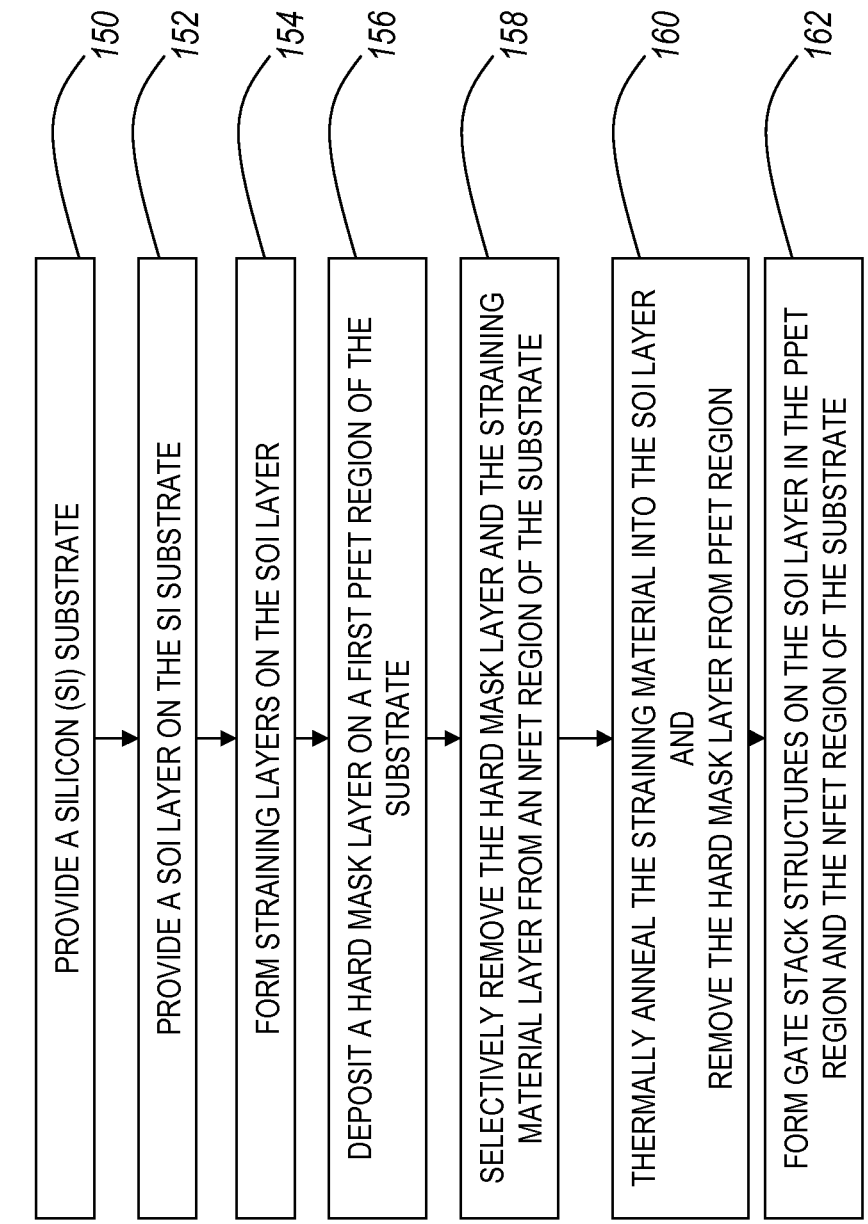
FIG. 20 is a logic flowchart of another disclosed embodiment herein pertaining to FIGS. 15-19.

FIG. 20 is a logic flowchart pertaining to FIGS. 15-19. This exemplary method provides a substrate (in step 150), provides a SOI substrate on the substrate (in step 152), conformally deposits a plurality of conformal layers on the top silicon layer of the SOI substrate (in step 154), deposits a hard mask layer on a first pFET channel region of the substrate (in step 156), and selectively removes the hard mask layer and the conformal layers from an nFET channel region of the substrate 158. The conformal layers are thermally annealed into the SOI substrate and the hard mask layer is removed from pFET channel region in step 160. Any remaining residue of the conformal layers can be cleaned from the SOI/STI regions after the thermal annealing of the conformal layers into the SOI substrate. Gate stack structures are formed on the SOI substrate in the pPET channel region and the nFET channel region of the substrate in step 162.

The straining material imparts a compressive strain to the surface Si channel of the first pFET device and converts a portion of the surface Si of the fin into an alloy of silicon. By introducing Ge in the channel by Ge diffusion in pFET ETSOI structures prior to the gate patterning, this processing lowers the threshold voltage and enhances carrier mobility. Thus, by thermally driving the Ge prior to forming the gate, the channel region receives the Ge and the Vt tuning of the pFET ETSOI transistor can be controlled in a precise manner.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of making a semiconductor device, said method comprising:
   patterning a first fin-type field effect transistor (FinFET) device and a second FinFET device on a substrate;
   successively depositing a plurality of conformal layers on both said first FinFET device and said second FinFET device, said conformal layers each comprising a straining agent;
   patterning a protective cap material only on portions of said conformal layers covering said first FinFET device;
   selectively removing said conformal layers only from said second FinFET device;
   thermally annealing said conformal layers to drive said straining agent from said conformal layers into said first FinFET; and
   applying a bias charge to said substrate during said depositing of said conformal layers on said first FinFET device and said second FinFET device.

2. The method of making a semiconductor device according to claim 1, said conformal layers comprising several monolayers of conformal material.

3. The method of making a semiconductor device according to claim 1, said bias charge comprising a bias below 3 kV.

4. The method of making a semiconductor device according to claim 1, said straining agent, which also moves the threshold voltage of the pFET device closer to band edge.

5. The method of making a semiconductor device according to claim 1, said thermal annealing driving said straining agent into lateral portions of said first FinFET device.

6. The method of making a semiconductor device according to claim 1, said straining agent comprising Germanium.

7. A method of making a semiconductor device, said method comprising:
   patterning a first fin-type field effect transistor (FinFET) device and a second FinFET device on a substrate, said first FinFET device having a first channel region and first source and drain regions on opposite sides of said first channel region, said second FinFET device having a second channel region and second source and drain regions on opposite sides of said second channel region;
   forming a gate insulator on said first FinFET device and said second FinFET device;
   patterning a gate conductor on portions of said gate insulator covering said first channel region and said second channel region;
   successively depositing a plurality of conformal layers on both said first FinFET device and said second FinFET device while applying a bias charge to said substrate, said conformal layers each comprising a straining agent;
   patterning a protective cap material only on portions of said conformal layers covering said first FinFET device;
   selectively removing said conformal layers only from said second FinFET device in said nFET region; and
   thermally annealing said conformal layers to drive said straining agent from said conformal layers into said first source and drain regions.

8. The method of making a semiconductor device according to claim 7, said conformal layers comprising several monolayers of conformal material.

9. The method of making a semiconductor device according to claim 7, said bias charge comprising a bias below 3 kV.

10. The method of making a semiconductor device according to claim 7, said straining agent imparting a stress to said first FinFET device.

11. The method of making a semiconductor device according to claim 7, said thermal annealing driving said straining agent into lateral portions of said first source and drain regions.

12. The method of making a semiconductor device according to claim 7, said straining agent comprising Germanium.

13. A method of making a semi-conductor device, said method comprising:
   patterning a first fin-type field effect transistor (FinFET) device on a substrate in a p-type field effect transistor (pFET) region of said substrate;
   patterning a second FinFET device on said substrate in an n-type field effect transistor (nFET) region of said substrate;
   plasma doping an impurity layer on said first FinFET device and said second FinFET device in said pFET region and said nFET region, respectively, while applying a bias charge to said substrate, said impurity layer comprising a straining agent;
   forming a protective cap on said first FinFET device in said pFET region;
   selectively removing said impurity layer from said second FinFET device in said nFET region; and
   thermally annealing said impurity into said first FinFET in said pFET region.

14. The method of making a semi-conductor device according to claim 13, said selectively removing of said impurity layer comprising:
   masking said first FinFET; and
   removing said impurity layer from said second FinFET.

15. The method of making a semi-conductor device according to claim 13, said bias charge comprising a bias below 3 kV.

16. The method of making a semi-conductor device according to claim 13, said plasma doping on said first FinFET device imparts a stress to said surface Si of said first FinFET device and converts a portion of said surface Si of said fin into an alloy of silicon and said impurity to one of lower threshold voltage and enhance carrier mobility, and said impurity comprising Germanium.

17. The method of making a semi-conductor device according to claim 13, said thermal annealing diffuses said impurity into lateral portions of said first FinFET device.

18. The method of making a semi-conductor device according to claim 13, said impurity comprising at least one of Germanium, Boron, Aluminum, Gallium, Antimony, Arsenic, and Phosphorous.

* * * * *